US011264367B2

(12) United States Patent
Chang et al.

(10) Patent No.: US 11,264,367 B2
(45) Date of Patent: Mar. 1, 2022

(54) ELECTRONIC DEVICE, OPTICAL MODULE AND MANUFACTURING PROCESS THEREOF

(71) Applicant: Advanced Semiconductor Engineering, Inc., Kaohsiung (TW)

(72) Inventors: Jung-Hsuan Chang, Kaohsiung (TW); Ying-Chung Chen, Kaohsiung (TW); Chao-Lin Shih, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 570 days.

(21) Appl. No.: 14/835,280

(22) Filed: Aug. 25, 2015

(65) Prior Publication Data

US 2016/0061653 A1 Mar. 3, 2016

(30) Foreign Application Priority Data

Aug. 26, 2014 (CN) .......................... 201410423978.9

(51) Int. Cl.
*G01J 1/04* (2006.01)
*H01L 25/16* (2006.01)
(Continued)

(52) U.S. Cl.
CPC .......... *H01L 25/167* (2013.01); *G01S 7/4813* (2013.01); *G01S 17/04* (2020.01); *G06F 1/3231* (2013.01); *H01L 31/167* (2013.01); *G01J 1/0209* (2013.01); *H01L 24/16* (2013.01); *H01L 24/32* (2013.01); *H01L 24/48* (2013.01); *H01L 24/73* (2013.01); *H01L 27/14678* (2013.01); *H01L 2224/16145* (2013.01);
(Continued)

(58) Field of Classification Search
CPC ... H01L 25/167; H01L 31/167; G01S 17/026; G01S 7/4813; G06F 1/3231
USPC ........................................................ 250/237
See application file for complete search history.

(56) References Cited

U.S. PATENT DOCUMENTS 5,173,766 A * 12/1992 Long ........................ H01L 21/50
257/668
6,272,160 B1 * 8/2001 Stronczer .............. H01S 5/0427
372/38.02
(Continued)

FOREIGN PATENT DOCUMENTS

CN 103383457 A 11/2013
CN 103477242 A 12/2013
(Continued)

OTHER PUBLICATIONS

Chinese First Office Action in Chinese patent application No. 201410423978.9, dated Mar. 3, 2016 and Search Report with English translation.
(Continued)

*Primary Examiner* — Georgia Y Epps
*Assistant Examiner* — Kevin Wyatt
(74) *Attorney, Agent, or Firm* — Foley & Lardner LLP

(57) ABSTRACT

The present disclosure relates to an optical module, including: a carrier, a emitter, a detector and an encapsulant. The carrier has a first surface. The emitter is disposed above the first surface. The detector is disposed above the first surface. The encapsulant is disposed on the first surface and exposes at least a portion of the emitter.

8 Claims, 8 Drawing Sheets

(51) Int. Cl.
    *G06F 1/3231*    (2019.01)
    *G01S 7/481*    (2006.01)
    *H01L 31/167*    (2006.01)
    *G01S 17/04*    (2020.01)
    *G01J 1/02*    (2006.01)
    *H01L 23/00*    (2006.01)
    *H01L 27/146*    (2006.01)

(52) U.S. Cl.
    CPC .............. *H01L 2224/16225* (2013.01); *H01L 2224/16245* (2013.01); *H01L 2224/32145* (2013.01); *H01L 2224/32225* (2013.01); *H01L 2224/32245* (2013.01); *H01L 2224/48091* (2013.01); *H01L 2224/48145* (2013.01); *H01L 2224/48227* (2013.01); *H01L 2224/48247* (2013.01); *H01L 2224/73265* (2013.01); *H01L 2924/00014* (2013.01); *H01L 2924/1815* (2013.01); *Y02D 10/00* (2018.01)

(56) References Cited

U.S. PATENT DOCUMENTS

| | | | | |
|---|---|---|---|---|
| 6,335,548 | B1* | 1/2002 | Roberts | H01L 23/49562 |
| | | | | 250/239 |
| 9,905,722 | B1* | 2/2018 | Chen | G01S 17/04 |
| 2004/0206972 | A1* | 10/2004 | Erchak | H01L 33/20 |
| | | | | 257/98 |
| 2008/0306719 | A1* | 12/2008 | Freier | G06T 15/50 |
| | | | | 703/13 |
| 2011/0133941 | A1 | 6/2011 | Yao et al. | |
| 2011/0297832 | A1* | 12/2011 | Yao | G01S 7/4813 |
| | | | | 250/353 |
| 2012/0305771 | A1* | 12/2012 | Lai | G01S 7/4813 |
| | | | | 250/338.4 |
| 2013/0015356 | A1* | 1/2013 | Shih | G01S 17/026 |
| | | | | 250/353 |
| 2013/0207126 | A1* | 8/2013 | Ankireddi | G01S 17/026 |
| | | | | 257/81 |
| 2013/0292553 | A1* | 11/2013 | Chang | G01J 1/04 |
| | | | | 250/216 |
| 2014/0097451 | A1* | 4/2014 | Lin | H01L 25/50 |
| | | | | 257/82 |
| 2015/0041630 | A1* | 2/2015 | Heng | G01S 17/04 |
| | | | | 250/216 |

FOREIGN PATENT DOCUMENTS

| | | |
|---|---|---|
| CN | 103487838 A | 1/2014 |
| CN | 103727965 A | 4/2014 |
| CN | 103748793 A | 4/2014 |
| KR | 20110028922 A | 3/2011 |
| TW | 201347218 A | 11/2013 |
| TW | 201351666 A | 12/2013 |

OTHER PUBLICATIONS

Second Office Action for Chinese Patent Application No. 201410423978.9, dated Oct. 10, 2016 and Search Report with English Translation, 10 pages.

* cited by examiner

ELECTRONIC DEVICE, OPTICAL MODULE AND MANUFACTURING PROCESS THEREOF

CROSS-REFERENCE TO RELATED PATENT APPLICATIONS

This application claims the benefit of and priority to P.R.C. (China) Patent Application No. 201410423978.9, filed 26 Aug. 2014, the contents of which are incorporated herein by reference in their entirety.

BACKGROUND

1. Technical Field

The present disclosure relates to an optical module, and an electronic device including the optical module, as well as a process for manufacturing the optical module.

2. Description of the Related Art

An optical module, for example, a proximity sensor, can be used to sense an object nearby the optical module. The optical module has a light-emitting source and an optical detector, where the optical detector can receive or sense light emitted by the light-emitting source and reflected by an external or nearby object, for example, infrared light, so that the presence of the external approaching object can be detected.

When an optical detector directly receives a light that is emitted from the light-emitting source, or detects light reflected from a medium different from the target object, there may be "cross talk," which is also considered noise and may lead to malfunction of the sensor. It is desirable to reduce such cross talk.

SUMMARY

One aspect of the present disclosure relates to an optical module including a carrier, an emitter, a detector and an encapsulant. The emitter is disposed above a first surface of the carrier. The detector is disposed above the first surface. The encapsulant is disposed on the first surface and exposes at least a portion of the emitter.

Another aspect of the present disclosure relates to an electronic device, including: an optical module and a light-transmitting plate. The optical module includes a carrier, an emitter, a detector and an encapsulant. The carrier has a first surface. The emitter is disposed above the first surface. The detector is disposed above the first surface. The encapsulant covers at least a portion of the emitter at a side of the emitter facing the detector. The light-transmitting plate is disposed above the optical module.

Another aspect of the present disclosure relates to a process for manufacturing an optical module, including: (a) providing a carrier, the carrier having a first surface; (b) disposing an emitter above the first surface; (c) disposing a detector above the first surface; and (d) applying an encapsulant to at least laterally surround the emitter, and expose at least a portion of the emitter.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are used to describe a certain component or certain plane of a component with respect to the orientation shown in the respective figure(s). It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
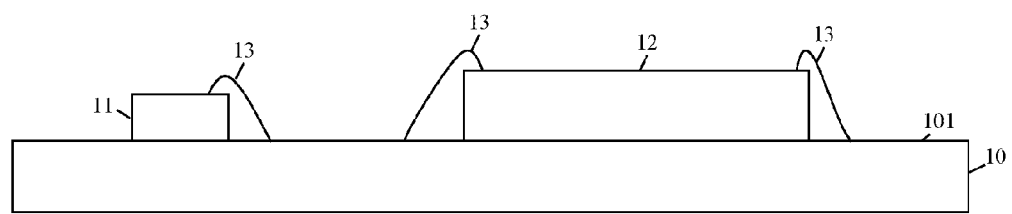
FIG. 1 and FIG. 2 illustrate a process of manufacturing an optical module according to an embodiment of the present disclosure.
Figure 2:
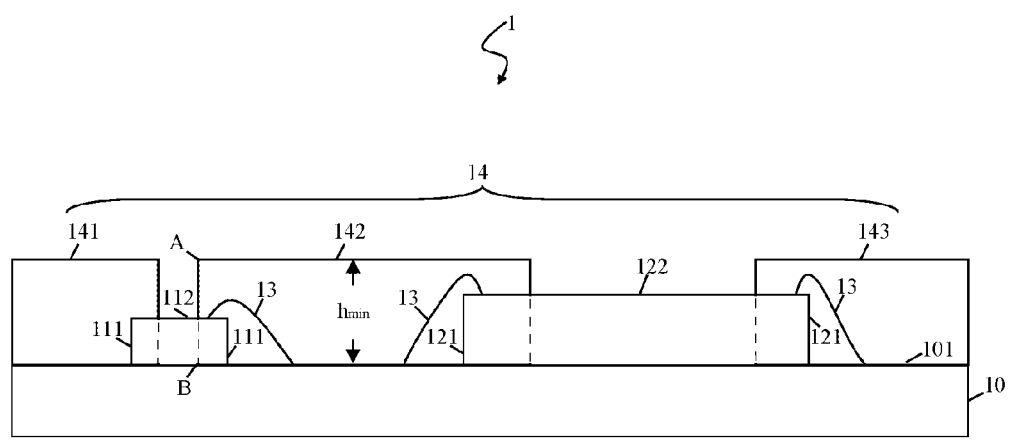

FIG. 1 and FIG. 2 illustrate a process for manufacturing an optical module 1 according to an embodiment of the present disclosure. Referring to FIG. 1, a carrier 10 is provided. The carrier 10 has a first surface 101. The carrier 10 may be, for example, a substrate (such as a printed circuit board), a lead frame, or a semiconductor die. A trace, a wire bonding pad and/or a via may be embedded in the carrier 10 or disposed on the carrier 10. The carrier 10 can be made of a material known by a person of ordinary skill in the art that can serve as a carrier. For example, the carrier 10 may include, but is not limited to, an organic material, a polymer material, silicon, silicon dioxide or other silicides. The carrier 10 may have a thickness of from about 50 µm to about 1100 µm.

An emitter 11 and a detector 12 are disposed on the first surface 101 of the carrier 10, and may be connected to the first surface 101 by, for example, a conductive or non-conductive adhesive. The emitter 11 and the detector 12 may be electrically connected to one or more wire bonding pads (not shown) disposed on the first surface 101 of the carrier 10 by conductive wires 13. The carrier 10 may further include a drive circuit (not shown) for driving the emitter 11 and the detector 12. A wire bonding pad disposed on the first surface 101 may electrically connect to the drive circuit of the carrier 10.

The emitter 11 may be, but is not limited to, an infrared light emitting diode (LED) die.

The detector 12 may be, but is not limited to, a photodiode that detects infrared light.

Referring to FIG. 2, an encapsulant 14 is formed on the first surface 101 of the carrier 10 to form an optical module 1. The encapsulant 14 laterally surrounds side surface 111 of the emitter 11 and side surface 121 of the detector 12. The encapsulant 14 may further cover a portion of a top surface 112 of the emitter 11, a portion of a top surface 122 of the detector 12, and at least a portion of the conductive wires 13. By way of reference, the encapsulant 14 may provide protection and optical functions similar to those provided by the lid 16 and the light-transmitting material 15 illustrated in FIG. 11A, 11B or 11C described below In one or more embodiments, the encapsulant 14 is an opaque encapsulant for IC packaging. For example, the encapsulant 14 may be a black molding compound, such as a black epoxy. In one or more embodiments, an opaque encapsulant has a light transmittance of less than about 10%, such as no greater than about 5%, no greater than about 4%, no greater than about 3%, no greater than about 2%, or no greater than about 1%, with respect to a peak wavelength or a range of wavelengths emitted by the emitter 11, such as in the infrared range.

As shown in FIG. 2, from the cross-sectional perspective, the encapsulant 14 may include a first-part encapsulant 141, a second-part encapsulant 142 and a third-part encapsulant 143.

The first-part encapsulant 141 may cover or surround a portion of the emitter 11. In an embodiment, the first-part encapsulant 141 covers a portion of the top surface 112 of the emitter 11 and/or a portion or all of the side surface 111 of the emitter 11. The second-part encapsulant 142 may cover or surround a portion of the emitter 11 and a portion of the detector 12. In an embodiment, the second-part encapsulant 142 covers a portion of the top surface 112 and/or a portion or all of the side surface 111 of the emitter 11. The second-part encapsulant 142 may further cover a portion of the top surface 122 and/or a portion or all of the side surface 121 of the detector 12. The third-part encapsulant 143 may cover or surround a portion of the detector 12. In an embodiment, the third-part encapsulant 143 covers a portion of the top surface 122 and/or a portion or all of the side surface 121 of the detector 12. In addition, the encapsulant 14 may expose a portion of the emitter 11 and/or expose a portion of the detector 12. In an embodiment, the encapsulant 14 exposes a portion of the top surface 112 of the emitter 11 and/or exposes a portion of the top surface 122 of the detector 12.

The second-part encapsulant 142 has a minimum thickness $h_{min}$. The second-part encapsulant 142 may have an upper surface above the top surface 112 of the emitter 11. As shown in FIG. 2, a side profile of the second-part encapsulant 142 may be, but is not limited to, a substantially rectangular shape. Thus, the minimum thickness $h_{min}$ may be the distance between the upper surface of the second-part encapsulant 142 and the first surface 101 of the carrier 10, or the distance between Point A and Point B in FIG. 2. Effects of the minimum thickness $h_{min}$ of the second-part encapsulant 142 will be described in detail hereinafter.

Figure 3:
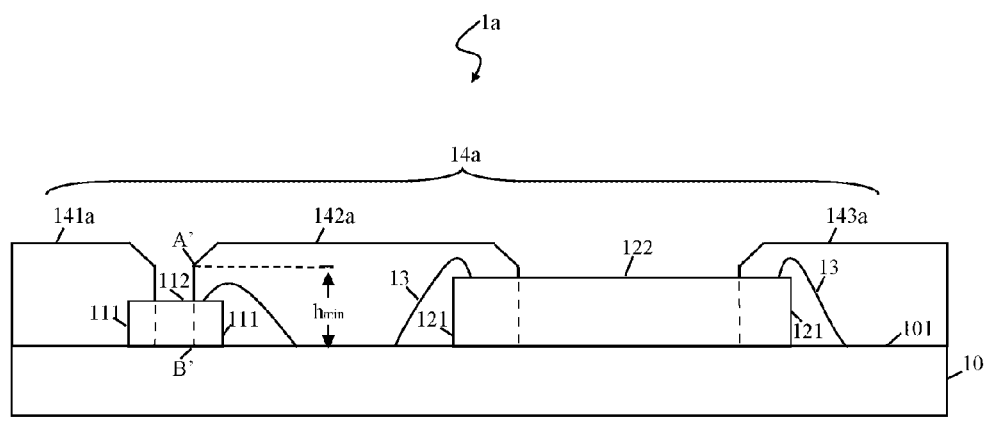
FIG. 3 illustrates a cross-sectional view of an optical module according to an embodiment of the present disclosure.

FIG. 3 illustrates a cross-sectional view of an optical module according to an embodiment of the present disclosure. The optical module 1a shown in FIG. 3 is similar to the optical module 1 shown in FIG. 2, except that an encapsulant 14a includes a first-part encapsulant 141a, a second-part encapsulant 142a, and a third-part encapsulant 143a. The first-part encapsulant 141a and the second-part encapsulant 142a have a sloped surface (such as a chamfering) at an edge above the top surface 112 of the emitter 11. The second-part encapsulant 142a and the third-part encapsulant 143a have a sloped surface (such as a chamfering) at an edge above the top surface 122 of the detector 12.

According to the mold used the first-part encapsulant 141a, the second-part encapsulant 142a, and the third-part encapsulant 143a of the encapsulant 14a each may have a substantially right angle at an edge above the emitter 11 or the detector 12, as shown in FIG. 2, or a sloped surface (such as a chamfering) at the edge above the emitter 11 or the detector 12, as shown in FIG. 3.

As shown in FIG. 3, the second-part encapsulant 142a has a minimum thickness $h_{min}$ at a portion of the edge above the top surface 112 of the emitter 11. The minimum thickness $h_{min}$ of the second-part encapsulant 142 may be, for example, a distance between Point A' and Point B' in FIG. 3. The effects of the minimum thickness $h_{min}$ of the second-part encapsulant 142 will be described in detail hereinafter.

Figure 4:
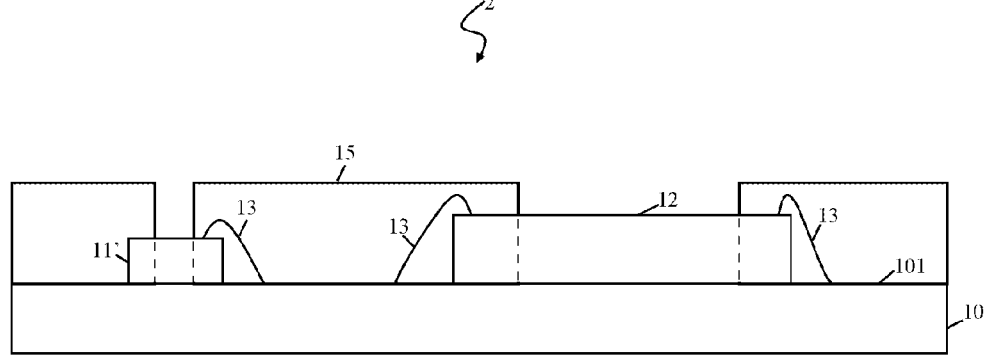
FIG. 4 illustrates a cross-sectional view of an optical module according to an embodiment of the present disclosure.

FIG. 4 illustrates a cross-sectional view of an optical module according to another embodiment of the present disclosure. The optical module 2 shown in FIG. 4 is similar to the optical module 1 shown in FIG. 2, except that, in the optical module 2 of FIG. 4, an emitter 11' and a light-transmitting encapsulant 15 respectively replace the emitter 11 and the encapsulant 14 of the optical module 1 shown in FIG. 2. The light-transmitting encapsulant 15 may cover a portion of the emitter 11', a portion of the detector 12, and at least a portion of the conductive wires 13. In one or more embodiments, the emitter 11' is a vertical-cavity surface-emitting laser (VCSEL) sold by Truelight, of which the product model is TSD-8B12-000, the typical beam divergence is 16 degrees, and the maximum beam divergence is 25 degrees. In other embodiments, the emitter 11' is another source of light.

Figure 5:
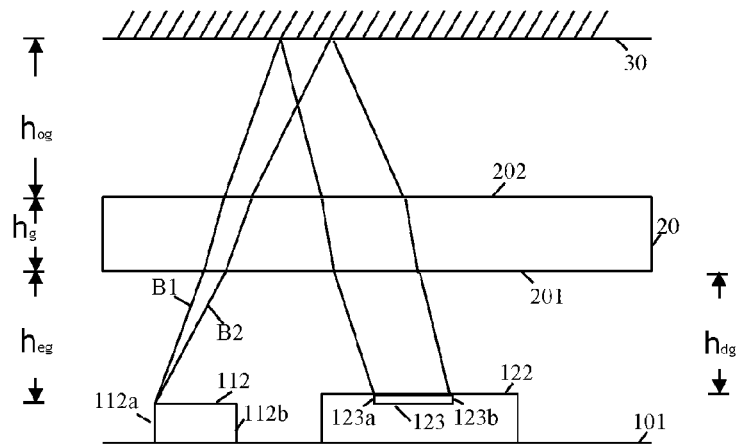
FIG. 5 illustrates a cross-sectional view of an optical module in an operating environment according to an embodiment of the present disclosure.

FIG. 5 illustrates how the optical module 1 illustrated in FIG. 2 or the optical module 1a illustrated in FIG. 3 operates according to an embodiment of the present disclosure. For purposes of the following discussions (and similarly for FIGS. 6-8), the emitter 11 and the detector 12 disposed on the first surface 101 of the carrier 10 are shown in FIG. 5 without the encapsulant 14 or 14a illustrated in FIG. 2 or FIG. 3, respectively.

The side surface 111 of emitter 11 is shown in FIG. 5 as having a first edge 112a and a second edge 112b. The second edge 112b is opposite to the first edge 112a, and a distance between the second edge 112b and the detector 12 is less than a distance between the first edge 112a and the detector 12.

The detector 12 includes a photosensitive region 123. The photosensitive region 123 has a third edge 123a and a fourth edge 123b. The fourth edge 123b is opposite to the third edge 123a, and a distance between the fourth edge 123b and the emitter 11 is greater than a distance between the third edge 123a and the emitter 11.

A medium 20 is disposed above the first surface 101. The medium 20 may be, but is not limited to, a glass plate or a thin plate made of a light-transmitting material, for example, a surface glass of a display screen of a smartphone. The medium 20 has a first surface 201 and a second surface 202. The second surface 202 is parallel to and opposite to the first surface 201, and a distance between the second surface 202 and the carrier 10 is greater than a distance between the first surface 201 and the carrier 10. The first surface 201 of the medium 20 is substantially parallel to the first surface 101 of the carrier 10.

An object 30 is disposed above the medium 20. The object 30 may be, but is not limited to, an object that can reflect light, for example, a surface of a user's face.

An upper surface 112 of the emitter 11 and a first surface 201 of the medium 20 are spaced apart from each other by a distance $h_{eg}$.

An upper surface of the photosensitive region 123 and the first surface 201 of the medium 20 are spaced apart from each other by a distance $h_{dg}$.

A thickness of the medium 20 between the first surface 201 and the second surface 202 is a thickness $h_g$.

A lower surface of the object 30 and the second surface 202 of the medium 20 are spaced apart from each other at a distance $h_{og}$.

The photosensitive region 123 can receive or detect light emitted by the emitter 11 and reflected by the object 30. For example, the first edge 112a of the emitter 11 may emit light B1 and B2 having different emission angles. The light B1 and B2, after passing through the medium 20 and reflecting from the lower surface of the object 30, may reach the third edge 123a and the fourth edge 123b of the photosensitive region 123, respectively.

Figure 6:
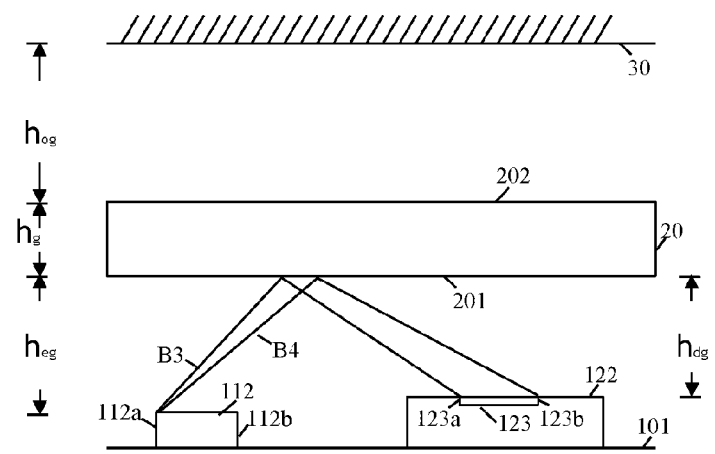
FIG. 6 illustrates a cross-sectional view of an optical module in an operating environment according to an embodiment of the present disclosure.

FIG. 6 illustrates how the optical module 1 illustrated in FIG. 2 or the optical module 1a illustrated in FIG. 3 operates according to an embodiment of the present disclosure. FIG. 6 is similar to FIG. 5, and illustrates that the first edge 112a of the emitter 11 in FIG. 6 may further emit light B3 and B4 having emission angles different from those of the light B1 and B2 in FIG. 5, and the emission angle of the light B3 is different from the emission angle of the light B4.

Because the light B3 and B4 leaves the emitter 11 at an angle different from that of the light B1 and B2 (for example, the emission angles of the light B3 and B4 are greater than the emission angles of the light B1 and B2), the light B3 and B4 may reach the third edge 123a and the fourth edge 123b of the photosensitive region 123, respectively, through reflection from the first surface 201 of the medium 20, rather than reflection from the object 30 as illustrated in FIG. 5. Therefore, an undesirable cross talk may be generated. The second-part encapsulant 142 or 142a illustrated in the optical module of FIG. 2 or FIG. 3, respectively, may be used to resolve this cross talk problem, for example, by blocking the light B3 and B4 shown in FIG. 6 from angles resulting in reflection from the first surface 201 of the medium 20.

Figure 7:
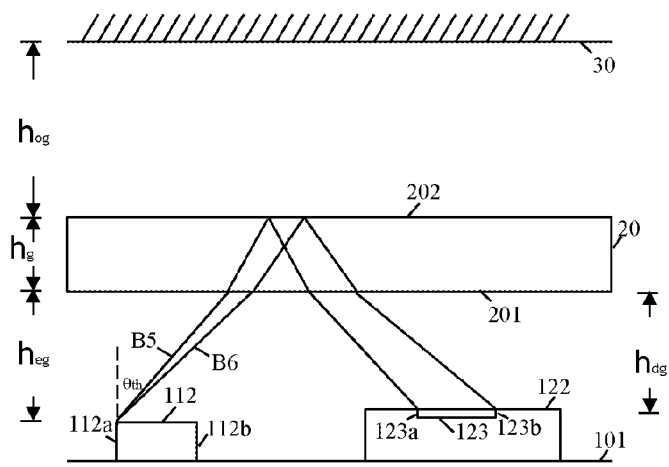
FIG. 7 illustrates a cross-sectional view of an optical module in an operating environment according to an embodiment of the present disclosure.

FIG. 7 illustrates how the optical module 1 illustrated in FIG. 2 or the optical module 1a illustrated in FIG. 3 operates according to an embodiment of the present disclosure. FIG. 7 is similar to FIG. 6, and illustrates that the first edge 112a of the emitter 11 may further emit light B5 and B6 having emission angles different from those of the light B3 and B4 in FIG. 6, and the emission angle of the light B5 is different from the emission angle of the light B6.

Because the light B5 and B6 leave the emitter 11 at an angle different from that of the light B3 and B4, the light B5 and B6 may reach the third edge 123a and the fourth edge 123b, respectively, of the photosensitive region 123 through reflection from the second surface 202 of the medium 20, rather than reflection from the first surface 201 as illustrated in FIG. 6. Therefore, such arrangement may also cause a cross talk. The second-part encapsulant 142 or 142a illustrated in the optical module of FIG. 2 or FIG. 3, respectively, may be used to resolve this cross talk problem, for example, by blocking the light B5 and B6 shown in FIG. 7 from angles resulting in reflection from the second surface 201 of the medium 20.

As shown in FIGS. 6 and 7, it may be desirable to use an encapsulant (such as the encapsulant 14 or 14a or FIG. 2 or 3, respectively) to block light such as illustrated by B3, B4 in FIG. 6 and B5, B6 in FIG. 7, so that such light is not reflected by the first surface 201 or the second surface 202 of the medium 20. Accordingly, the encapsulants 14 and 14a of respective FIGS. 2 and 3 have a minimum thickness $h_{min}$ at an edge above the emitter 11. Therefore, cross talk may be significantly reduced, or eliminated.

Figure 8:
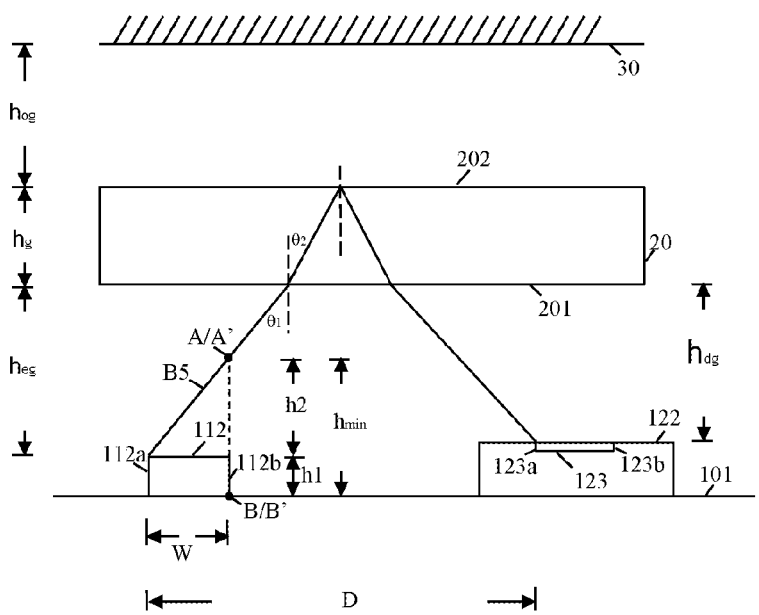
FIG. 8 illustrates a cross-sectional view of an optical module in an operating environment according to an embodiment of the present disclosure.

FIG. 8 illustrates how the optical module 1 illustrated in FIG. 2 or the optical module 1a illustrated in FIG. 3 operates according to an embodiment of the present disclosure. FIG. 8 is similar to FIG. 7, except that the light B6 is omitted for the ease of analysis and explanation of FIG. 8.

The minimum thickness $h_{min}$ of the encapsulant 14 or 14a in FIG. 2 or FIG. 3, respectively is a sufficient thickness to prevent light emitted from the emitter 11 and reflected by the first surface 201 and the second surface 202 of the medium 20 from reaching the photosensitive region 123 of the detector 12. For example, the minimum thickness $h_{min}$ of the encapsulant 14 or 14a is designed to block light having an emission angle greater than or equal to $\theta_{th}$ from reaching the medium 20 and being reflected from the first surface 201 or the second surface 202 to cause cross talk.

The minimum thickness $h_{min}$ of the encapsulant 14 or 14a may be, but is not limited to, a distance between Point A and Point B or a distance between Point A' and Point B' in FIG. 8. The Point A and the Point A' may indicate the same position in FIG. 8, which may be the Point A and the Point A' in FIG. 2 and FIG. 3, respectively. The Point B and the Point B' in FIG. 8 may indicate the same position in FIG. 8, which may be the Point B and the Point B' in FIG. 2 and FIG. 3, respectively.

As shown in FIG. 8, the emitter 11 has a first thickness h1. A width W of the emitter 11 is a width from the first edge 112a and the second edge 112b of the emitter 11. A vertical distance between the upper surface 112 of the emitter 11 and the Point A or the Point A' may be defined as h2. The first edge 112a and the third edge 123a of the photosensitive region 123 are spaced apart from each other by a distance D.

The minimum thickness $h_{min}$ of the encapsulant 14 or 14a in FIG. 2 or FIG. 3, respectively, is equal to the first thickness h1 of the emitter 11 plus the vertical distance h2 between the upper surface 112 of the emitter 11 and the Point A or the Point A'; that is, equation (1) is met.

$$h_{min} h1+h2 \tag{1}$$

In FIG. 8, the light B5 emitted from the first edge 112a of the emitter 11 enters an intermediate medium, which may be, but is not limited to, air. For example, in FIG. 8, the light B5 traverses the intermediate medium in the volume between the emitter 11 and the medium 20. The intermediate medium has a first refractive index $n_1$.

The medium 20 different from the intermediate medium is located above the carrier 10 and faces the first surface 101 of the carrier 10. The medium 20 has a second refractive index $n_2$.

When the light B5 is emitted at an emission angle $\theta_1$ from the first edge 112a of the emitter 11, the light will enter the first surface 201 of the medium 20 through the intermediate medium at a first incident angle $\theta_1$; and have a first refraction angle $\theta_2$ after entering the first surface 201 of the medium 20 from the intermediate medium. If the light B5 is not blocked from entering the medium 20 from the intermediate medium, the light B5 will reach the third edge 123a of the photosensitive region 123 after being reflected by the second surface 202 of the medium 20. According to Snell's Law, the first incident angle $\theta_1$ and the first refraction angle $\theta_2$ should have the relationship shown in equation (2).

$$n_1 \sin \theta_1 = n_2 \sin \theta_2 \qquad (2)$$

The distance D between the first edge 112a of the emitter 11 and the third edge 123a of the photosensitive region 123, the second distance $h_{eg}$ between the upper surface 112 of the emitter 11 and the first surface 201 of the medium 20, the distance $h_{dg}$ between the upper surface of the photosensitive region 123 and the first surface 201 of the medium 20, the first incident angle $\theta_1$, the first refraction angle $\theta_2$, and the thickness $h_g$ of the medium 20 should satisfy equation (3).

$$D(h_{eg} + h_{dg}) \tan \theta_1 + 2 h_g \tan \theta_2 \qquad (3)$$

That is, the tangent value of the first incident angle $\theta_1$ can be obtained by dividing a difference obtained by the distance D minus a double product of the thickness $h_g$ and a tangent value of the first refraction angle $\theta_2$ by the sum of the second distance $h_{eg}$ and the distance $h_{dg}$.

The vertical distance h2 between the upper surface 112 of the emitter 11 and the Point A or the Point A' is a product obtained by multiplying the width W by a cotangent value of the first incident angle $\theta_1$; that is, equation (4) is satisfied.

$$h2 = W \cot \theta_1 \qquad (4)$$

The first incident angle $\theta_1$ and the first refraction angle $\theta_2$ that satisfies equation (2) can be obtained by using, for example, an Iterative Method. That is, the first incident angle $\theta_1$ can be introduced into the equation (2) in a numerical order (from small value to large value or from large value to small value). For example, a variety of potential first incident angles $\theta_1$ from 0 degree to 90 degrees may be introduced into the equation (2) to obtain the corresponding first refraction angles $\theta_2$. In other words, each first incident angle $\theta_1$ will have a corresponding first refraction angle $\theta_2$. The obtained multiple pairs of the first incident angles $\theta_1$ and the first refraction angles $\theta_2$ can be verified for the distance D using equation (3). For the pairs of first incident angles $\theta_1$ and first refraction angles $\theta_2$ that satisfy equation (3), a tangent value ($\tan \theta_1$) of the smallest first incident angle $\theta_1$ can be obtained according to equation (3) and used to determine the vertical distance h2 between the upper surface 112 of the emitter 11 and the Point A or the Point A' according to equation (4). The minimum thickness $h_{min}$ of the encapsulant 14 or 14a can be determined according to equation (1) as the result h2 of equation (4) plus the first thickness h1 of the emitter 11.

Figure 9:
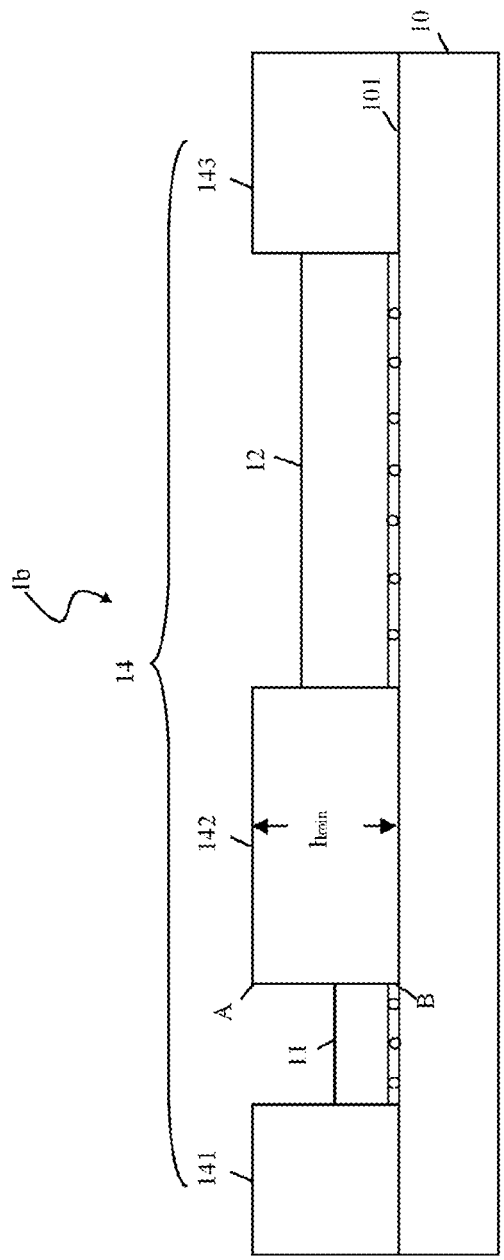
FIG. 9 illustrates a cross-sectional view of an optical module according to an embodiment of the present disclosure.

FIG. 9 illustrates a cross-sectional view of an optical module according to an embodiment of the present disclosure. The optical module 1b shown in FIG. 9 is similar to the optical module 1 shown in FIG. 2, except that in FIG. 9, the emitter 11 is a flip-chip type die and the detector 12 is a flip-chip type die, which replace the wire-bonded emitter 11 and detector 12 in the optical module 1. In addition, the conductive wire 13 is removed in FIG. 9.

In this manner, the encapsulant 14 may laterally surround the emitter 11 and the detector 12 without covering them, which is different from the implementation where the wire-bonded emitter 11 and detector 12 are used, where the encapsulant 14 covers at least portions of the conductive wires 13 so that the bonding points and the conductive wires 13 can be protected. However, to ensure that the detector 12 would not receive the light emitted from the emitter 11 and reflected by the first surface 201 or the second surface 202 of the medium 20, the minimum thickness (i.e., the distance between points A and B) of the encapsulant is essentially the same as illustrated in FIG. 8, and thus is not repeated with respect to FIG. 9.

Figure 10:
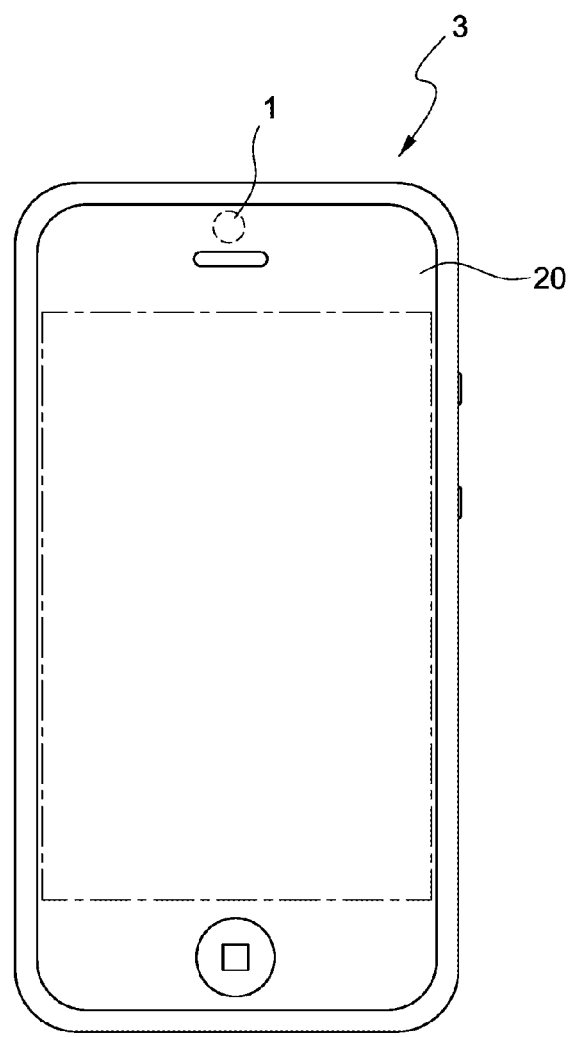
FIG. 10 illustrates a cross-sectional view of an electronic device according to an embodiment of the present disclosure.

FIG. 10 illustrates a view of an electronic device 3 including an optical module such as one of the optical modules illustrated in FIG. 2, 3, 4 or 9, according to an embodiment of the present disclosure. The electronic device 3 may be, for example, a smartphone, a tablet computer, a watch computer, or the like. The electronic device 3 may include, but is not limited to, the optical module 1, 1a, 2 or 1b shown in FIG. 2, 3, 4 or 9, respectively, and a light-transmitting panel as medium 20 shown in FIGS. 5 to 8.

Referring back to FIG. 8, the medium 20 shown in FIG. 8 may be, but is not limited to, a light-transmitting panel, such as the light-transmitting panel of the electronic device 3 shown in FIG. 10 (e.g., a surface glass of a display screen of a smartphone).

A specific example of the embodiment of FIG. 8 is as follows. The thickness $h_g$ of the medium 20 is about 0.7 mm; the first width W between the first edge 112a and the second edge of the emitter 11 is about 0.25 mm; the distance D between the first edge 112b and the third edge 123 of the photosensitive region 123 is about 1.575 mm; the second distance $h_{eg}$ between the upper surface of the emitter 11 and the first surface 201 of the medium 20 is about 1.4 mm; the distance $h_{dg}$ between the upper surface of the photosensitive region 123 and the first surface 201 of the medium 20 is about 1.4 mm; and the first thickness h1 of the emitter 11 is about 0.15 mm. In this specific example, the refractive index $n_1$ of the intermediate medium is about 1 (such as air), and the refractive index $n_2$ of the medium 20 is about 1.5. Thus, for this specific example, a relationship of $\sin \theta_1 = 1.5 \sin \theta_2$ can be obtained according to equation (2); and a first incident angle $\theta_1$ of about 25.7 degrees and a first refraction angle $\theta_2$ of about 16.8 degrees can be obtained according to equation (3). Then, the vertical distance h2=0.519 mm between the upper surface of the emitter 11 and the Point A or Point A' can be obtained according to equation (4). The minimum thickness $h_{min}$=h1+h2=0.15+0.519=0.669 mm of the encapsulant 14 or 14a at the second edge 112b can be then obtained according to equation (1).

Given the values in the specific example above for an optical module and the ambient environment of FIG. 8, the first incident angle $\theta_1$ or the emission angle may have a critical value of about 25.7 degrees. Therefore, the encapsulant 14 of an opaque material can be used to block light having an emission angle of greater than or equal to 25.7 degrees; that is, to block light whose emission angle is greater than or equal to 25.7 degrees from reaching the medium 20, so as to prevent cross talk.

In an embodiment of the present disclosure illustrated in FIG. 4, the emitter 11 may be a VCSEL, for example, a product model TSD-8B12-000 sold by Truelight, of which the typical beam divergence is 16 degrees and the maximum beam divergence is 25 degrees, and the light emission angle of the emitter 11 is between 8 degrees and 12.5 degrees. In other words, in this embodiment, the emitter 11 having a light emission angle of less than 25.7 degrees can be used to achieve the effect of preventing the cross talk without using the encapsulant 14 or 14a of an opaque material, because light having an emission angle of greater than or equal to 25.7 degrees is not emitted. In such a case, the encapsulant 14 or 14a may be a light-transmitting material or an opaque material; and the minimum thickness of the encapsulant 14 or 14a near the exposed emitter 11 may not be limited to the $h_{min}$ mentioned above, provided that the coverage and size thereof can achieve the effect of protecting the emitter.

A single molding step may be used for the process illustrated in FIG. 2, for example, to allow the encapsulant 14 to surround or cover a portion of the emitter 11, a portion of the detector 12, and at least a portion of the conductive wires 13 located on the carrier 10. Cross talk may be significantly reduced or eliminated by designing the minimum thickness of the encapsulant 14 according to the techniques mentioned above. In this manner, the effect of protecting the emitter, the detector and the related electrical connections that are typically provided by a lid and a light-transmitting material in the conventional technology can also be achieved. Therefore, according to the present disclosure, not only the cross talk but also the cost associated with the lid may be significantly reduced or eliminated. In addition, since a lid may be omitted according to the present disclosure, the size of the optical module may be greatly reduced.

Figure 11A:
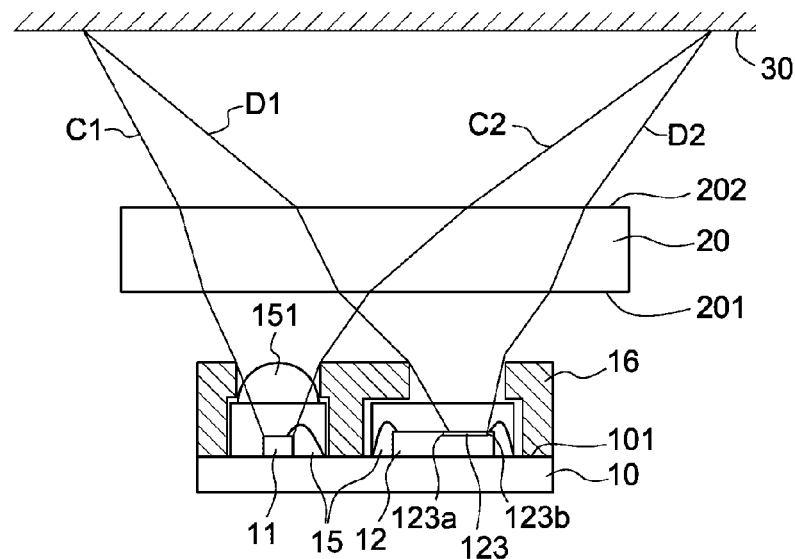
FIG. 11A illustrates an optical module in an operating environment.

FIG. 11A illustrates an optical module with a lid for comparison. In addition to covering an emitter 11 and a detector 12 with a light-transmitting material 15 to provide protection for the photoelectric element and electrical connections, the optical sensing module shown in FIG. 11A also has a lens portion 151 above the emitter 11 to increase a luminous efficiency, such as luminescence and condensation. In addition, the lid 16 is used to prevent light emitted by the emitter 11 from directly reaching a photosensitive region 123 of the detector 12, which also has a function of protecting internal optical optoelectronic components as well as related wires and connecting points.

Although the lid 16 can prevent the light emitted by the emitter 11 from reaching the photosensitive region 123, it can be learned from the light distribution range illustrated in FIG. 11A that the photosensitive region 123, in addition to receiving light within D1 and D2 ranges (that is, the light emitted within the C1 and C2 ranges and reflected by an object 30), may also receive light reflected by a first surface 201 and a second surface 202 of a medium 20. Hence, according to the optical module shown in FIG. 11A, about 80% of received power of the light may become cross talk signals.

Figure 11B:
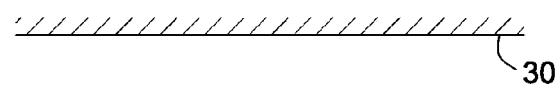
FIG. 11B illustrates an optical module in an operating environment.

To demonstrate the cross talk phenomenon more clearly by taking FIG. 11B as an example, the distribution range of cross talk light emitted from the emitter 11 may be defined as C3 and C4, and after reflection via the second surface 202, the distribution range of the light reaching the photosensitive region may be defined as D3 and D4. In other words, light emitted from the emitter and within the range between C3 and C4 may be reflected by the second surface 202 and reach the photosensitive region 123, to form a major source of the cross talk. In addition, reflection may also occur at the first surface 201.

Figure 11C:
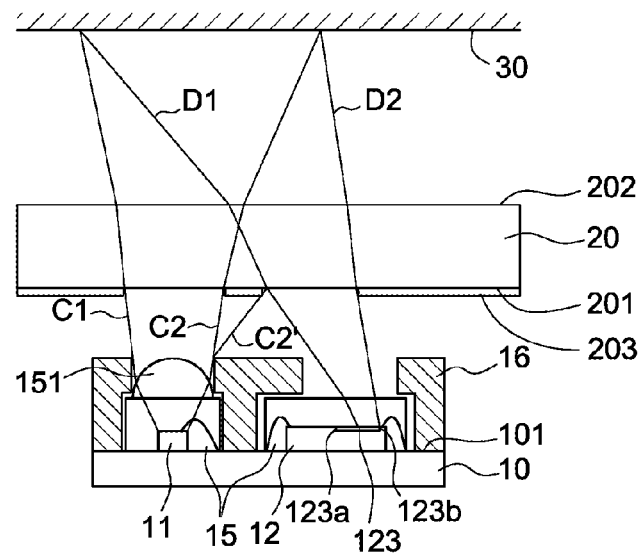
FIG. 11C illustrates an optical module in an operating environment.

The optical module shown in FIG. 11C is similar to the optical module shown in FIG. 11A, and a difference between them is that the medium 20 in FIG. 11C additionally includes, on the first surface 201, an infrared absorption layer 203 to absorb a portion of reflected light that would otherwise become cross talk (for example, infrared light). Compared with the optical module shown in FIG. 11A, although the infrared absorption layer 203 in FIG. 11C can relatively reduce the cross talk significantly, the infrared absorption layer 203 still has its disadvantages as it cannot affect the detectable range of a reflection object. Thus, light (for example, light C2') accounting for about 4.5% of the total power detected may still become cross talk signals. In addition, since the infrared absorption layer 203 is formed by technologies such as a silk-screen printing, the pollution, the process steps, and the cost are more.

Moreover, the lid 16 will increase the size of the optical module and process complexity, thus increasing the cost of manufacturing the optical module and the occupied space.

Figure 11D:
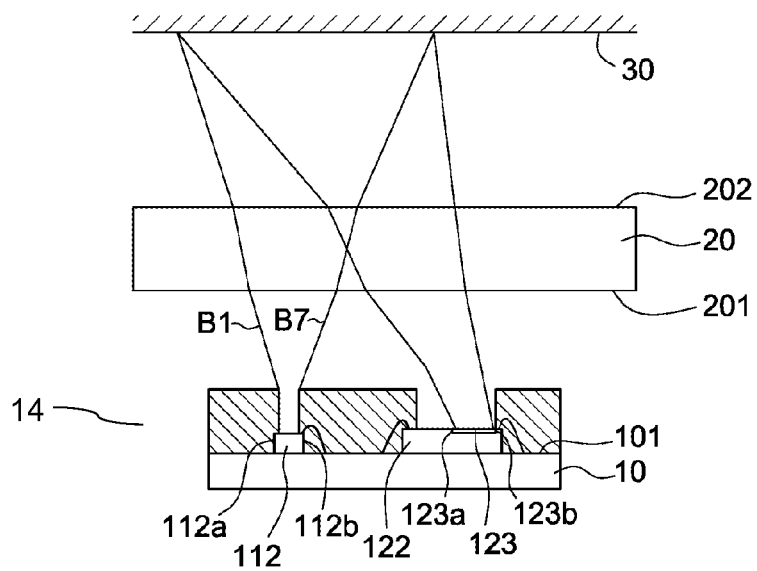
FIG. 11D illustrates a cross-sectional view of an optical module according to an embodiment of the present disclosure.

FIG. 11D illustrates a cross-sectional view of an optical module according to an embodiment of the present disclosure. The optical module shown in FIG. 11D and the optical module shown in FIGS. 11A to 11C are different in that FIG. 11D marks that the light emitted by the emitter 11 not surrounded or covered is limited by an encapsulant 14. Since the encapsulant 14 can block the light whose emission angle is greater than or equal to 25.7 degrees from reaching the medium 20, the cross talk can be avoided or reduced without the lid 16 shown in FIGS. 11A to 11C. Further, the encapsulant 14 can also, to some extent, still provide certain functions of protecting the emitter and the detector covered or surrounded, as well as protecting the connective wires and the connecting points. In addition, because the lid 16 and the lens portion 151 can be omitted, the size of the optical module (such as the thickness) can be reduced. In the optical structure of FIG. 11D, the sum of the minimum thickness of the encapsulant 14 and the thickness of the carrier 10 is about 0.82 mm in one or more embodiments. That is, compared with the optical module shown in FIGS. 11A to C, the optical module in FIG. 11D not only can reduce cross talk (to almost 0%) but also can significantly reduce the size. In addition, the optical module in FIG. 11D does not require a lid, an infrared absorption layer or a lens portion. Therefore, the cost is relatively less and it is less likely to produce pollution.

As used herein and not otherwise defined, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, two values, such as characterizing a size in terms of a width or a height, can be about the same or matching if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a "substantially right angle" can refer to 90°±10°, such as 90°±5°, 90°±4°, 90°±3°, 90°±2°, 90°±1°, 90°±0.5°, 90°±0.1°, or 90°±0.05°. For another example, the term "substantially parallel" with respect to two edges or surfaces can refer to an angular displacement between the two edges or surfaces being less than or equal to 10°, such as less than or equal to 5°, less than or equal to 3°, less than or equal to 2°, or less than or equal to 1°.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, process, or process to the objective, spirit and scope of the present disclosure. All such modifications are intended to be within the scope of the claims appended hereto. While the processes disclosed herein have been described with reference to particular operations performed in a particular order, it will be understood that these operations may be combined, sub-divided, or re-ordered to form an equivalent process without departing from the teachings of the present disclosure. Accordingly, unless specifically indicated herein, the order and grouping of the operations are not limitations of the present disclosure.

What is claimed is:

1. An electronic device, comprising:
   an optical module, comprising:
      a carrier having a first surface;
      an emitter disposed above the first surface;
      a detector disposed above the first surface; and
      an encapsulant covering at least a portion of the emitter at a side of the emitter facing the detector; and
   a light-transmitting plate disposed above the optical module,
   wherein at least a portion of an upper surface of the emitter is covered by the encapsulant and at least a portion of the upper surface of the emitter is exposed to air, and wherein a thickness of the encapsulant is configured so that the light emitted by the emitter to be incident on the light-transmitting plate has an incident angle less than a critical value $\theta_{th}$ with respect to the light-transmitting plate,
   wherein the encapsulant exposes a portion of the emitter, and the exposed portion of the emitter has a first edge and a second edge, the second edge is opposite to the first edge, and a distance between the second edge and the detector is less than a distance between the first edge and the detector, and wherein the side of the emitter facing the detector is the second edge;
   wherein the encapsulant further exposes a portion of the detection, and the exposed portion of the detector further comprises a photosensitive region, the photosensitive region has a third edge and a fourth edge, the fourth edge is opposite to the third edge, and a distance between the fourth edge and the emitter is greater than a distance between the third edge and the emitter;
   wherein the light-transmitting plate has a second surface and a third surface, and a distance between the third surface and the carrier is greater than a distance between the second surface and the carrier;
   wherein the emitter is configured to emit the light emitted by the emitter to be incident on the light-transmitting plate at an incident angle $\theta_1$, the maximum value of the incident angle $\theta_1$ is a critical value $\theta_{th}$, the critical value $\theta_{th}$ meets a first equation $n_1 \sin \theta_{th} = n_2 \sin \theta_2$ and a second equation: $D = (h_{eg} + h_{dg}) \tan \theta_{th} + 2h_g \tan \theta_2$, wherein n1 is a refractive index of an intermediate medium disposed between the first surface and the light-transmitting plate, $n_2$ is an refractive index of the light-transmitting plate, $\theta_2$ is a first refraction angle generated by the first light when entering into the light-transmitting plate at an incident angle of the critical value $\theta_{th}$, D is a distance between the first edge and the third edge, $h_{eg}$ is a distance between the upper surface of the emitter and the second surface of the light-transmitting plate, $h_{dg}$ is a distance between an upper surface of the photosensitive region and the second surface of the light-transmitting plate, and hg is a thickness between the second surface and the third surface of the light-transmitting plate.

2. The electronic device according to claim 1, wherein the encapsulant at least laterally surrounds at least a portion of the detector, and exposes at least a portion of the detector.

3. The electronic device according to claim 1, wherein the encapsulant is opaque.

4. The electronic device according to claim 1, wherein the encapsulant transmits light.

5. The electronic device according to claim 1, wherein the encapsulant is configured to block the light emitted from the emitter and having an incident angle of greater than or equal to the critical value $\theta_{th}$ from entering the light-transmitting plate.

6. The electronic device according to claim 5, wherein the emitter has a first thickness h1, the first edge and the second edge are spaced apart from each other at a first distance W, the encapsulant adjacent to the second edge has a second thickness at the second edge, the second thickness is greater than a minimum thickness value hmin, a difference between the minimum thickness value hmin and the first thickness h1 of the emitter is h2, and h2 meets the following equation: $h2 = W \cot \theta_{th}$.

7. The electronic device according to claim 1, wherein the critical value $\theta_{th}$ is 25.7 degrees.

8. The electronic device according to claim 1, wherein the emitter is a vertical-cavity surface-emitting laser.

\* \* \* \* \*